United States Patent
Shiraishi (10) Patent No.: US 10,014,857 B2
(45) Date of Patent: Jul. 3, 2018

(54) SIGNAL OUTPUT CIRCUIT

(71) Applicant: DENSO WAVE INCORPORATED, Chita-gun, Aichi-pref. (JP)

(72) Inventor: Yuji Shiraishi, Oobu (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 131 days.

(21) Appl. No.: 14/853,094

(22) Filed: Sep. 14, 2015

(65) Prior Publication Data

US 2016/0190379 A1    Jun. 30, 2016

(30) Foreign Application Priority Data

Dec. 26, 2014 (JP) ................. 2014-265365

(51) Int. Cl.
| | |
|---|---|
| *H03K 17/68* | (2006.01) |
| *H03K 17/785* | (2006.01) |
| *H03K 17/687* | (2006.01) |
| *H03K 17/689* | (2006.01) |
| *H03K 17/06* | (2006.01) |

(52) U.S. Cl.
CPC ....... *H03K 17/785* (2013.01); *H03K 17/6877* (2013.01); *H03K 17/689* (2013.01); *H03K 2017/066* (2013.01)

(58) Field of Classification Search
CPC ............. H03K 17/785; H03K 17/6877; H03K 2017/066; H03K 17/689
See application file for complete search history.

(56) References Cited

U.S. PATENT DOCUMENTS

2006/0289649 A1* 12/2006 Sugiura ............... G06K 7/0008
235/451

FOREIGN PATENT DOCUMENTS

JP    H08-242157 A    9/1996

* cited by examiner

*Primary Examiner* — Tony Ko
(74) *Attorney, Agent, or Firm* — Oliff PLC (57) ABSTRACT

A signal output circuit includes a signal conversion element, a signal output transistor, a first resistor element, a second resistor element, a diode, a malfunction-prevention transistor, and a capacitance-compensating capacitor. The signal output transistor establishes electrical conduction between two conductive terminals when an on signal is supplied to a conduction control terminal via the signal conversion element. The diode is connected in parallel to the second resistor element in a direction in which current flows between a signal output terminal of the signal conversion element and the conduction control terminal of the signal output transistor when an on signal is outputted to the signal output terminal. The malfunction-prevention transistor establishes electrical conduction between two conductive terminals when a current flows through the second resistor element in a direction opposite the direction of the diode. The capacitance-compensating capacitor is connected in parallel to the second resistor element.

7 Claims, 7 Drawing Sheets

| | REQUIRED SPECIFICATION | BEFORE ADDITION OF CAPACITOR | NO TRANSISTOR 5 | CAPACITOR ADDED | | | |
|---|---|---|---|---|---|---|---|
| | | | | 68pF | 100pF | 120pF | 1000pF |
| ON DELAY | 2000μs | 32μs | 31μs | 32μs | 32μs | 32μs | 33μs |
| OFF DELAY | 2000μs | 763μs | 1572μs | 770μs | 776μs | 780μs | 912μs |

FIG.3

| | Pattern | | Criteria | Pass Level | Margin | Judgment |
|---|---|---|---|---|---|---|
| Output Lines (Out) | BEFORE ADDITION OF CAPACITOR | | 10V | 8V | -2V | NG |
| Output Lines (Out+VDC) | | | 10V | 8V | -2V | NG |
| Output Lines (Out) | 1(120pF) | | 10V | 13V | 3V | Pass |
| Output Lines (Out+VDC) | | | 10V | 13V | 3V | Pass |
| Output Lines (Out) | 2(100pF) | | 10V | 13V | 3V | Pass |
| Output Lines (Out+VDC) | | | 10V | 13V | 3V | Pass |
| Output Lines (Out) | 3(68pF) | | 10V | 13V | 3V | Pass |
| Output Lines (Out+VDC) | | | 10V | 13V | 3V | Pass |
| Output Lines (Out) | 4(22pF) | | 10V | 13V | 3V | Pass |
| Output Lines (Out+VDC) | | | 10V | 13V | 3V | Pass |
| Output Lines (Out) | 5(10pF) | | 10V | 13V | 3V | Pass |
| Output Lines (Out+VDC) | | | 10V | 13V | 3V | Pass |
| Output Lines (Out) | 6(5pF) | | 10V | 13V | 3V | Pass |
| Output Lines (Out+VDC) | | | 10V | 13V | 3V | Pass |
| Output Lines (Out) | 7(4pF) | | 10V | 13V | 3V | Pass |
| Output Lines (Out+VDC) | | | 10V | 12V | 2V | Pass |
| Output Lines (Out) | 8(3pF) | | 10V | 13V | 3V | Pass |
| Output Lines (Out+VDC) | | | 10V | 11V | 1V | Pass |
| Output Lines (Out) | 9(1pF) | | 10V | 13V | 3V | Pass |
| Output Lines (Out+VDC) | | | 10V | 11V | 1V | Pass |

| Noise Level | ON State | OFF State |
|---|---|---|
| 8V(Criteria) | Pass | – |
| 9V(Criteria) | Fail | – |
| 10V(Criteria) | Fail | Pass |
| 13V(Margin) | – | Pass |

| Noise Level | ON State | OFF State |
|---|---|---|
| 8V(Criteria) | Pass | – |
| 9V(Criteria) | Fail | – |
| 10V(Criteria) | Fail | Pass |
| 13V(Margin) | – | Pass |

(4mm × 4.5mm) + (2mm × 1.25mm) =
20.5mm²
25 mm² EVEN INCLUDING WIRING

FIG.9

SIGNAL OUTPUT CIRCUIT

CROSS-REFERENCE TO RELATED APPLICATION

This application is based on and claims the benefit of priority from Japanese Patent Application No. 2014-265365, filed Dec. 26, 2014, the disclosure of which is incorporated herein in its entirety by reference.

BACKGROUND

1. Technical Field

The present invention relates to a signal output circuit that has a signal output transistor.

2. Related Art

For example, there is a switching apparatus that is configured using a metal-oxide-semiconductor field-effect transistor (MOSFET) for outputting a control signal to a controlled-apparatus side in a programmable controller. In a switching apparatus such as that above, JP-H08-242157 discloses the following configuration to prevent the occurrence of a flash-on phenomenon when power is turned on.

This switching apparatus includes an N-channel MOSFET (hereinafter referred to as "FET"), a PNP transistor, and two resistor elements (first and second resistor elements). A gate of the FET is connected to the second resistor element of which one end is connected to a base of the PNP transistor and the other end is connected to an emitter of the PNP transistor. A collector of the PNP transistor is connected to a source of the FET. The first resistor element is connected between the base and the collector of the PNP transistor.

In the configuration above, when power is turned on, if a current flows from the drain of the FET to the gate side of the FET via a junction capacitance Cgd in the FET, the current flows to the two resistor elements and the PNP transistor is turned on. Therefore, flash-on is prevented as a result of the gate of the FET being held low. In addition, in this configuration, when the FET is turned on, a current for discharging the charged electric charge of a junction capacitance Cgs in the PET also flows to the two resistor elements. The PNP transistor is thereby turned on. Thus, the above-described discharging is promoted, off delay time can also be shortened.

In the switching apparatus such as that described above, there is a constant demand for size reduction. When the inventors of the present application confirmed operation after actually reducing the size of the FET included in the switching apparatus in JP-H08-242157, a problem occurred in that, as a result of decrease in the junction capacitance of the FET, while the effect of shortening the off delay time was unaffected, the flash on/off phenomenon could no longer be prevented.

SUMMARY

It is thus desired to provide a signal output circuit that can surely prevent the flash on/off phenomenon even when a small-size signal output transistor is used.

An exemplary embodiment of the present disclosure provides a signal output circuit that includes a signal conversion element, a signal output transistor, a first resistor element, a second resistor element, a diode, a malfunction-prevention transistor, and a capacitance-compensating capacitor.

The signal conversion element has a signal output terminal, converts an input electrical signal to an optical signal, converts the optical signal to an electrical signal, and outputs the electrical signal via the signal output terminal.

The signal output transistor has a first potential reference-side conductive terminal, a first non-potential reference-side conductive terminal, and a first conduction control terminal, and establishes electrical conduction between the first potential reference-side conductive terminal and the first non-potential reference-side conductive terminal when an on signal is supplied to the first conduction control terminal via the signal conversion element.

The first resistor element is connected between the signal output terminal of the signal conversion element and the first potential reference-side conductive terminal of the signal output transistor. The second resistor element is connected between the signal output terminal of the signal conversion element and the first conduction control terminal of the signal output transistor.

The diode is connected in parallel to the second resistor element in a direction in which current flows between the signal output terminal of the signal conversion element and the first conduction control terminal of the signal output transistor when an on signal is outputted to the signal output terminal of signal conversion element.

The malfunction-prevention transistor that has a second potential reference-side conductive terminal, a second non-potential reference-side conductive terminal, and a second conduction control terminal. The second conduction control terminal is connected to the signal output terminal of signal conversion element. The second potential reference-side conductive terminal is connected to the first conduction control terminal of the signal output transistor. The second non-potential reference-side conductive terminal is connected to the first potential reference-side conductive terminal of the signal output transistor. The malfunction-prevention transistor establishes electrical conduction between the second potential reference-side conductive terminal and the second non-potential reference-side conductive terminal when a current flows through the second resistor element in a direction opposite the direction of the diode.

The capacitance-compensating capacitor is connected in parallel to the second resistor element.

In a signal output circuit of the exemplary embodiment, an inputted electrical signal undergoes electrophoto conversion and photoelectric conversion by the signal conversion element, and is outputted to a signal output terminal. The first and second resistor elements are respectively connected between the signal output terminal of the signal conversion element and the potential reference-side conductive terminal of the signal output transistor, and between the signal output terminal of the signal conversion element and the conduction control terminal of the signal output transistor. The diode is connected in parallel to the second resistor element in a direction in which current flows between the signal output terminal and the conduction control terminal when an on signal is outputted to the signal output terminal.

In addition, the conduction control terminal of the malfunction-prevention transistor is connected to the signal output terminal. The potential reference-side conductive terminal of the malfunction-prevention transistor is connected to the conduction control terminal of the signal output transistor. The non-potential reference-aside conductive terminal of the malfunction-prevention transistor is connected to the potential reference-side conductive terminal of the signal output transistor. As a result, when a current flows through the second resistor element in a direction opposite the direction of the diode, conduction is established between the conductive terminals of the malfunction-prevention transistor. In addition, a capacitance-compensating capacitor is connected in parallel to the second resistor element.

As a result of a configuration such as this, the basic circuit operation of the malfunction-prevention transistor is the same as that of the switching apparatus disclosed in JP-H08-242157. In addition, as a result of the capacitance-compensating capacitor being provided, even when a small-size element having low junction capacitance is used as the signal output transistor, capacitance can be compensated in the signal output circuit of the present invention. Therefore, the flash on/off phenomenon can be prevented with certainty.

DESCRIPTION OF EMBODIMENTS

First Embodiment

A first embodiment will hereinafter be described with reference to FIGS. 1 to 8.

Figure 1:
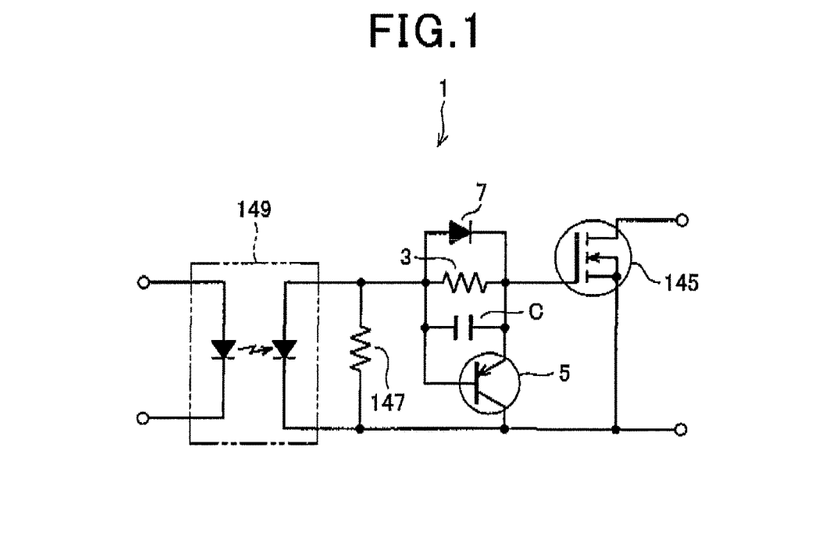
FIG. 1 is a diagram of a signal output circuit according to a first embodiment.

FIG. 1 is a diagram showing a configuration of a signal output circuit 1 according to a first embodiment. The signal output circuit 1 of the present embodiment may be applicable to a switching apparatus that is configured using a MOSFET for outputting a control signal to a controlled-apparatus side in a programmable controller. The signal output circuit 1 may be also applicable to an industrial apparatus such as an industrial robot. This signal output circuit 1 includes a photovoltaic coupler (signal conversion element) 149, a N-channel MOSFET (signal output transistor) 145, a first resistor (first resistor element) 147, a second resistor (second resistor element) 3, a diode 7, PNP transistor (malfunction-prevention transistor) 5, and a capacitance-compensating capacitor C.

The photovoltaic coupler 149 has a signal output terminal, converts an input electrical signal to an optical signal, converts the optical signal to an electrical signal, and outputs the electrical signal to the signal output terminal.

The N-channel MOSFET 145 has a source (first potential reference-side conductive terminal), a drain (first non-potential reference-side conductive terminal), and a gate (first conduction control terminal), and establishes electrical conduction between the source and drain when an on signal is outputted to the gate via the photovoltaic coupler 149.

The first resistor 147 is connected between the signal output terminal of the photovoltaic coupler 149 and the source of the N-channel MOSFET 145. The second resistor 3 is connected between the signal output terminal of the photovoltaic coupler 149 and a the gate of the N-channel MOSFET 145.

The diode 7 is connected in parallel to the second resistor 3 in a direction in which current flows between the signal output terminal of the photovoltaic coupler 149 and the gate of the N-channel MOSFET 145 when an on signal is outputted to the signal output terminal of photovoltaic coupler 149.

The PNP transistor 5 has an emitter (second potential reference-side conductive terminal), a collector (second non-potential reference-side conductive terminal), and a base (second conduction control terminal). The gate is connected to the signal output terminal of the photovoltaic coupler 149. The emitter is connected to the gate of the N-channel MOSFET 145. The collector is connected to the source of the N-channel MOSFET 145. The PNP transistor 5 establishes electrical conduction between the emitter and the collector when a current flows through the second resistor 3 in a direction opposite the direction of the diode 7.

The capacitance compensating capacitor C is connected in parallel to the second resistor 3.

In the configuration above, when power is turned on, if a current flows from the drain of the N-channel MOSFET 145 to the gate side of the N-channel MOSFET 145 via a junction capacitance Cgd in the N-channel MOSFET 145, the current flows to the second resistor 3 and the first resistor 147 and the PNP transistor 5 is turned on. Therefore, flash-on is prevented as a result of the gate of the N-channel MOSFET 145 being held low. In addition, in this configuration, when the N-channel MOSFET 145 is turned on, a current for discharging the charged electric charge of a junction capacitance Cgs in the N-channel MOSFET 145 also flows to the second resistor 3 and the first resistor 147. The PNP transistor 5 is thereby turned on. Thus, the discharging is promoted, off delay time can also be shortened.

Here, it is assumed that an N-channel MOSFET 145 (FET) of a size smaller than the element presumed in JP-A-H08-242157 is used according to the present embodiment. The characteristics of the FET conceived for conventional use and the FET conceived for use according to the present embodiment are, for example, as below.

|  | Conventional | Present embodiment |
|---|---|---|
| Allowable loss | 20 W | 0.5 W |
| Rated drain current | 5 A | 2 A |
| Input capacitance | 370 pF | 140 pF |
| Feedback capacitance | 60 pF | 50 pF |
| Output capacitance | 180 pF | 40 pF |

Figure 7:
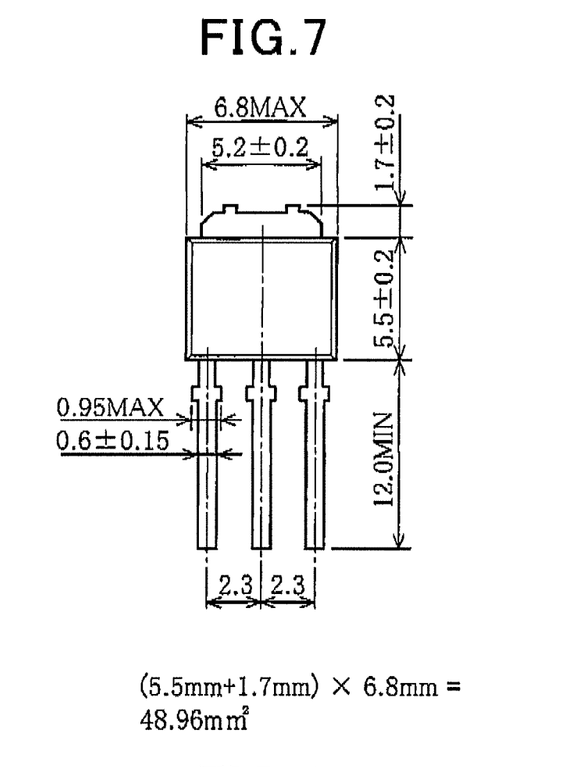
FIG. 7 is a diagram of an outer shape size of an FET conceived for conventional use, in a resin mold package.

FIG. 7 shows the outer shape size of the FET conceived for conventional use that is in a resin mold package. The area occupied by the main body, excluding the lead portion, is $$(5.5 \text{ mm}+1.7 \text{ mm}) \times 6.8 \text{ mm} = 48.96 \text{ mm}^2$$

Figure 8:
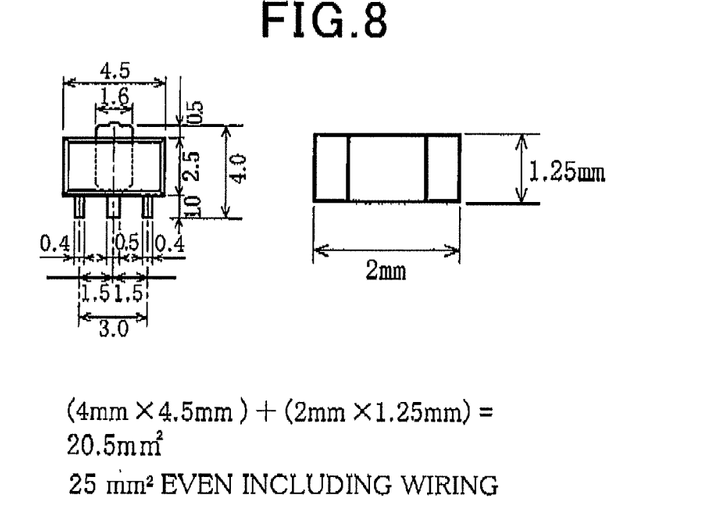
FIG. 8 is a diagram of an outer shape size of an FET conceived for use according to the present embodiment, in a resin mold package.

Meanwhile, FIG. 8 shows the outer shape size of the FET conceived for use according to the present embodiment that is in a resin mold package. The area occupied by the main body is (4 mm×4.5 mm)+(2 mm×1.25 mm)=20.5 mm²

The area is about 25 mm² even when the lead portion is included. Therefore, the package size is about half the conventional package size.

A signal output circuit 1 of the present embodiment is that in which, in the configuration shown in JP-A-H08-242157, the capacitance compensating capacitor C is connected in parallel to the second resistor 3. In other words, the capacitance compensating capacitor C is provided to compensate for reduction injunction capacitance accompanying size reduction of the N-channel MOSFET 145.

Figure 2:
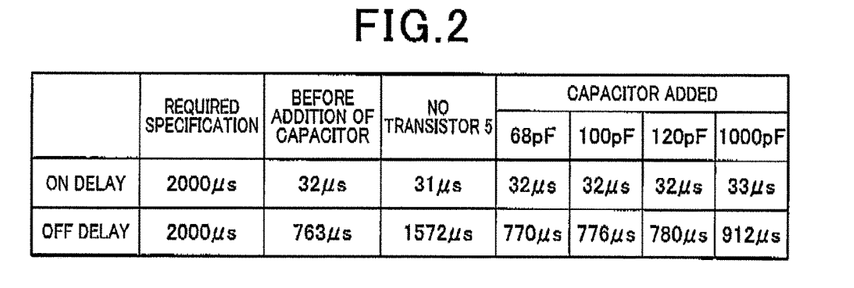
FIG. 2 is a diagram of on delay times and off delay times when a capacitance of a capacitor is changed.

As shown in FIG. 2, the on delay time and the off delay time required in the signal output circuit 1 are both, for example, 2000 μs. In this regard, in a configuration in which the PNP transistor 5 is not provided, the on delay time is 31 μs and is provided with a sufficient margin. However, the off delay time is 1572 μs, and the margin is small. In the configuration in JP-A-H08-242157 in which the PNP transistor 5 is provided and the capacitance compensating capacitor C is not provided (before addition of capacitor), the on delay time is 32 μs and the off delay time is 763 μs. Sufficient margins can be ensured.

When the capacitance compensating capacitor C is provided and the capacitance thereof is changed to 68 pF, 100 pF, 120 pF, and 1000 pF, the on delay time ranges from 32 μs to 33 μs and shows little change. The off delay time ranges from 770 μs to 780 μs when the capacitance ranges from 68 pF to 120 pF. When the capacitance is 1000 pF, the off delay time is 912 μs, indicating a slight increase. However, the off delay time does not significantly increase. Based on these results, a capacitance of 100 pF is considered suitable for the capacitance compensating capacitor C.

Figure 3:
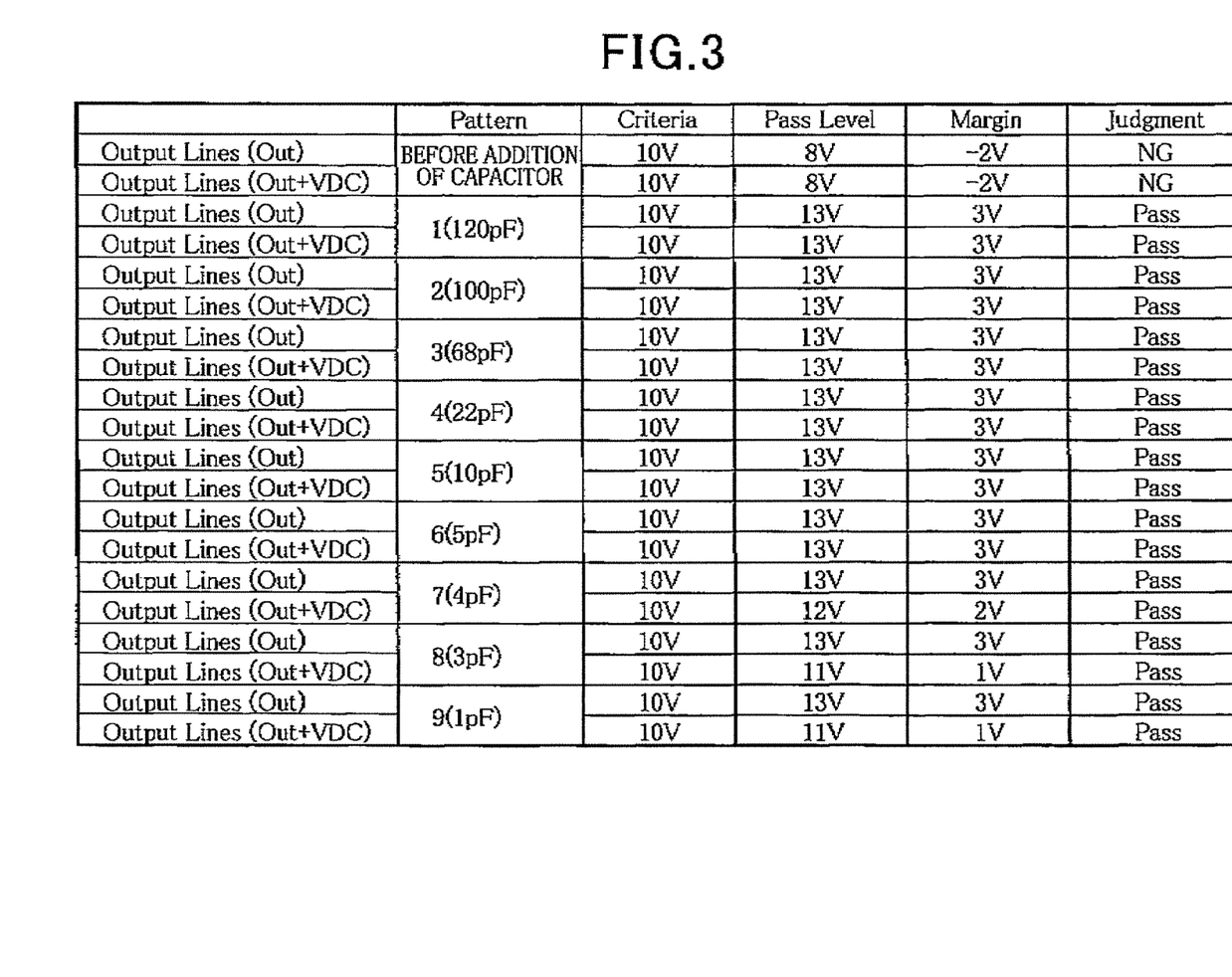
FIG. 3 is a diagram of the results of a flash off test when a capacitance of the capacitor is changed.

In addition, noise was applied to the signal output circuit 1, and a flash off test was conducted. In this test, determination is made regarding whether or not the FET 145 is turned off when noise voltage is applied between the source (+VDC) and drain (Out) and to the drain alone while the N-channel MOSFET 145 is on. As shown in FIG. 3, the passing value (Pass) is 10 V. The pass level is 8 V when the capacitor C is not provided, and therefore, indicates failure. The passing level exceeds 10 V oven when the capacitance of the capacitor C is 1 pF. However, the margin is small. A margin of 3 V can be ensured when the capacitance is 100 pF. Therefore, taking into consideration the results in FIG. 2 as well, the capacitance is preferably set to 100 pF. A similar test was also conducted for flash on. The results indicate passing for both noise levels 10 V and 13 V.

Figure 5A:
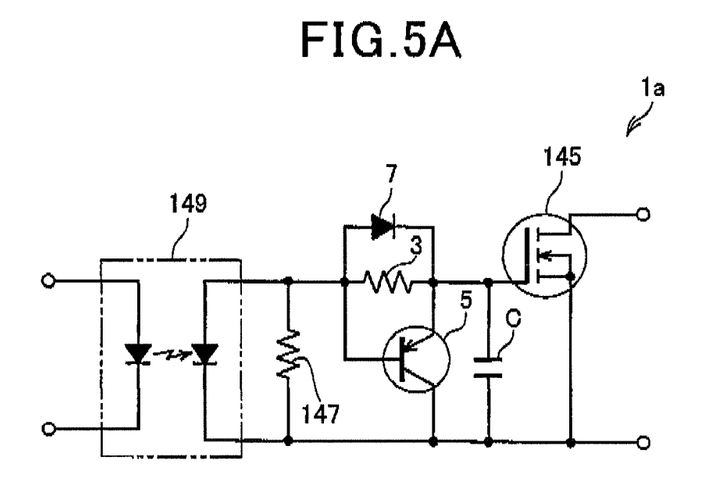
FIGS. 5A and 5B are diagrams of results of a flash on/off test performed on the configuration of the first comparative example shown in FIG. 4B.
Figure 5B:
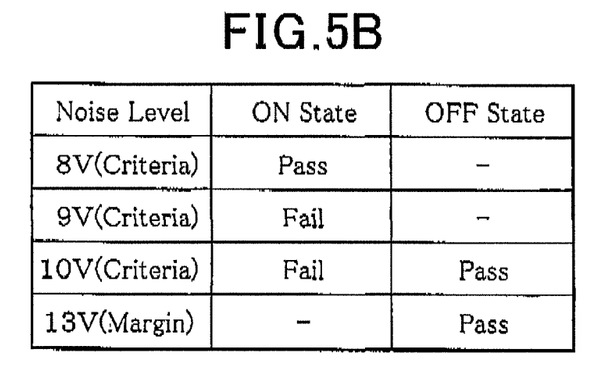
Figure 6A:
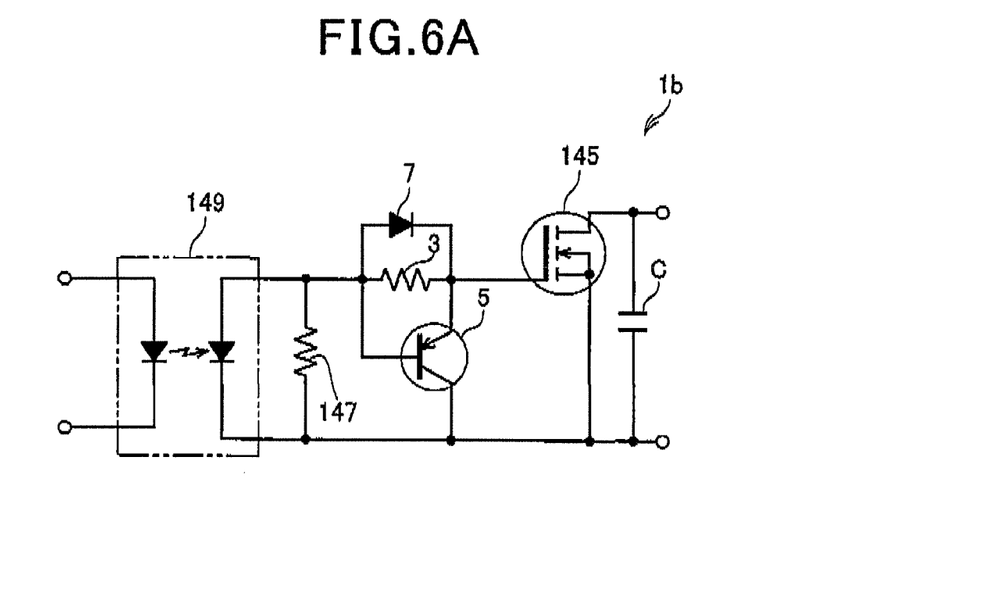
FIGS. 6A and 6B are diagrams of results of a flash on/off test performed on the configuration of the second comparative example shown in FIG. 4C.
Figure 6B:
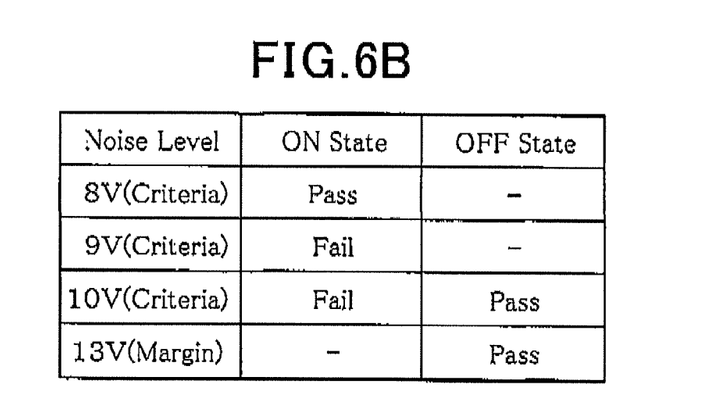

Here, in examining compensation of capacitance accompanying size reduction of the N-channel MOSFET 145 as shown in the signal output circuit 1 according to the present embodiment, the flash on/off test was also conducted for the following cases. That is, the flash on/off test was conducted for when the capacitor C is connected between the gate (conduction control terminal) and the source (potential reference-side conductive terminal) of the N-channel MOSFET 145, as shown in shown in a signal output circuit 1a of a first comparative example of FIG. 4B. In addition, the flash on/off test was conducted for when the capacitor C is connected between the drain (non-potential reference-side conductive terminal) and the source of the N-channel MOSFET 145, as shown in a signal output circuit 1b of a second comparative example of FIG. 4C. As shown in FIG. 5 and FIG. 6, the results indicate that the pass levels remained at 8 V in all flash off tests and the passing value could not be reached.

Reasons for the failures were examined. As shown in the signal output circuit 1 of FIG. 4A, in the configuration according to the present embodiment, when the gate of the N-channel MOSFET 145 is held high and turned ON, both ends of the capacitance compensating capacitor C have the same potential. Therefore, the capacitance compensating capacitor C is not charging. Charging occurs when noise is applied. Meanwhile, in the configuration of the signal output circuit 1a of the first comparative example shown in FIG. 4B, potential difference occurs between the two ends of the capacitor C when the N-channel MOSFET 145 is turned ON. Therefore, the capacitance compensating capacitor C is charging. Consequently, when noise is applied, the capacitor C is unable to absorb the noise.

Figure 4A:
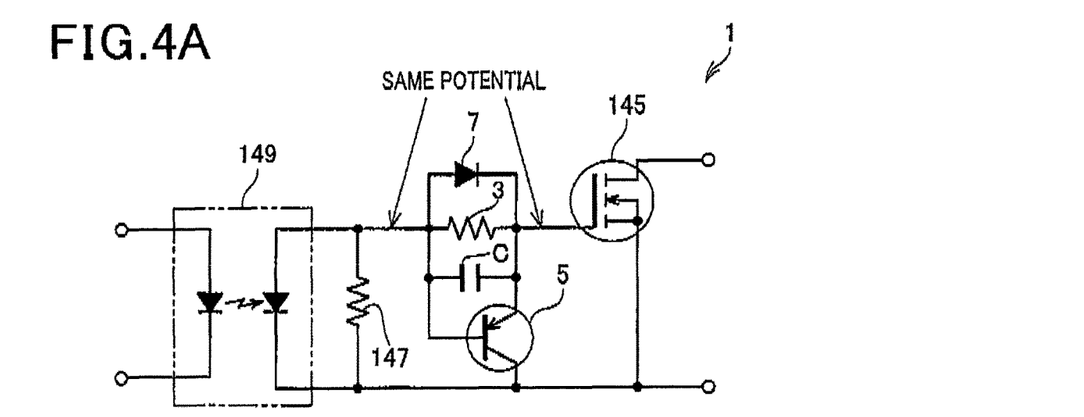
FIG. 4A is a diagram of a configuration in which the present embodiment is used.
Figure 4B:
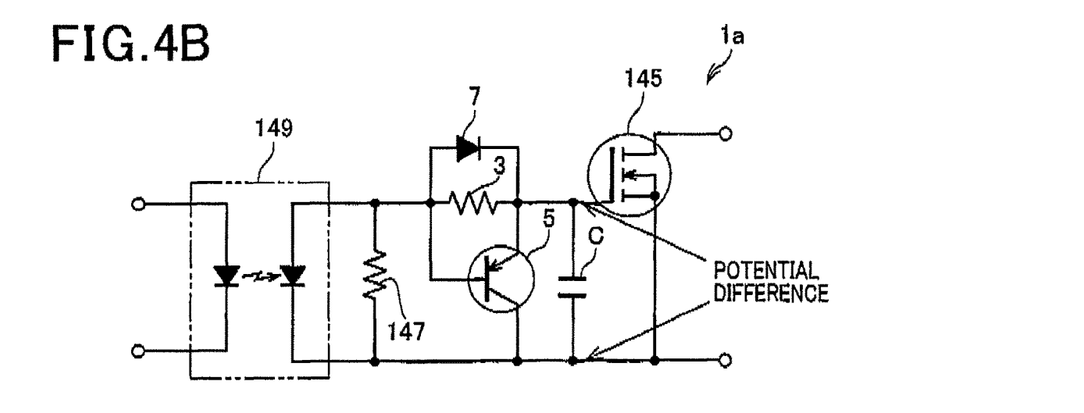
FIG. 4B and FIG. 4C are diagrams of configurations of first and second comparative examples examining the connection locations of the capacitor.
Figure 4C:
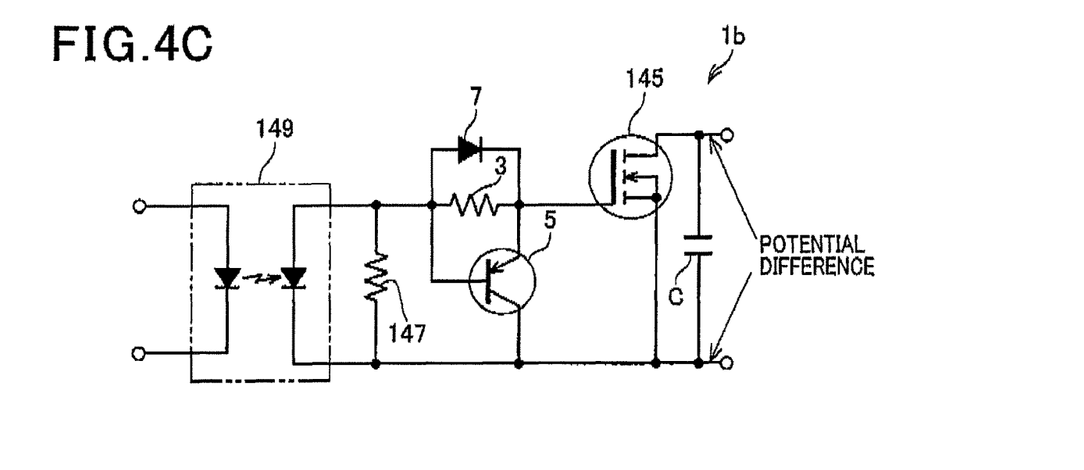

In addition, in the configuration of the signal output circuit 1b of the second comparative example shown in FIG. 4C as well, when the N-channel MOSFET 145 is turned ON, a slight potential difference corresponding to the voltage across the drain and source of the N-channel MOSFET 145 occurs between the two ends of the capacitance compensating capacitor C. Therefore, the capacitor C is charging. In addition, because the capacitance compensating capacitor C is connected to the output side of the N-channel MOSFET 145 in the first place, improving noise resistance is considered difficult.

As described above, according to the present embodiment, an inputted electrical signal undergoes electrophoto conversion and photoelectric conversion by the photovoltaic coupler 149, and is outputted to the signal output terminal. The first resistor 147 and the second resistor 3 are respectively connected between the signal output terminal of photovoltaic coupler 149 and the source of the N-channel MOSFET 145, and between the signal output terminal and the gate of the N-channel MOSFET 145. A diode 7 is connected in parallel to the resistor 3 in a direction in which current flows between the signal output terminal and the gate when an on signal is outputted to the signal output terminal of the photovoltaic coupler 149.

In addition, the base (conduction control terminal) of the PNP transistor 5 is connected to the signal output terminal of the photovoltaic coupler 149. The emitter (potential reference-side conductive terminal) is connected to the gate of the N-channel MOSFET 145. The collector (non-potential reference-side conductive terminal) is connected to the source of the N-channel MOSFET 145. As a result, when a current flows through the resistor 3 in the direction opposite the direction of the diode 7, conduction is established between the emitter and the collector of the PNP transistor 5. The capacitance-compensating capacitor C is connected in parallel to the resistor 3. Therefore, even when a small-size element having low junction capacitance is used in the N-channel MOSFET 145, the capacitance can be compensated by the capacitance compensating capacitor C. Therefore, the flash on/off phenomenon can be prevented with certainty.

Second Embodiment

Figure 9:
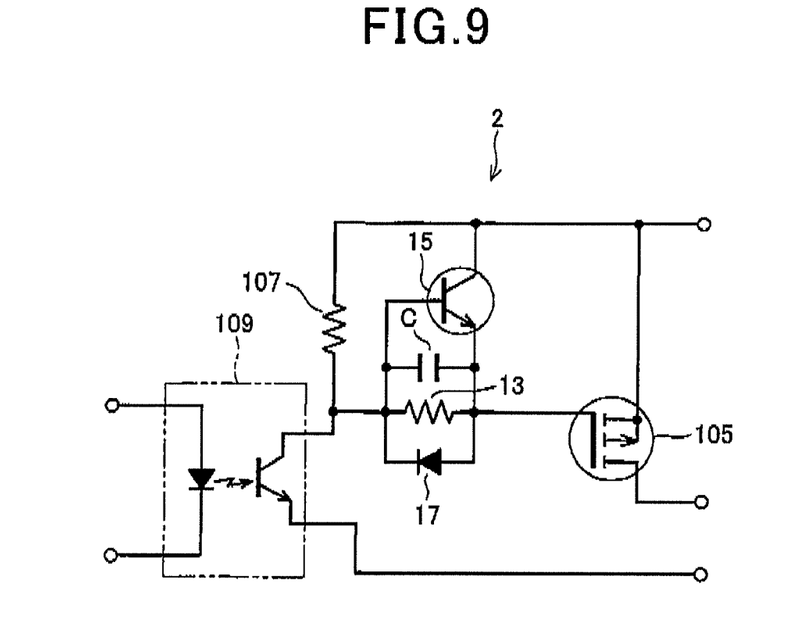
FIG. 9 is a diagram of a signal output circuit according to a second embodiment.

FIG. 9 is a diagram showing a configuration of a signal output circuit 2 according to a second embodiment. The signal output circuit 2 of the present embodiment is configured using a P-channel MOSFET 105 (signal output transistor) instead of the N-channel MOSFET 145 in the first embodiment.

This signal output circuit 2 includes a photovoltaic coupler (signal conversion element) 109, a P-channel MOSFET 105, a first resistor (first resistor element) 107, a second resistor (second resistor element) 13, a diode 17, NPN transistor (malfunction-prevention transistor) 15, and a capacitance-compensating capacitor C.

The photocoupler 109 has a signal output terminal, converts an input electrical signal to an optical signal, converts the optical signal to an electrical signal, and outputs the electrical signal to the signal output terminal.

The P-channel MOSFET 105 has a source (first potential reference-side conductive terminal), a drain (first non-potential reference-side conductive terminal), and a gate (first conduction control terminal), and establishes electrical conduction between the source and drain when an on signal is outputted to the gate via the photocoupler 109.

The first resistor 107 is connected between the signal output terminal of the photocoupler 109 and the source of the P-channel MOSFET 105. The second resistor 13 is connected between the signal output terminal of the photocoupler 109 and the gate of the P-channel MOSFET 105.

The diode 17 is connected in parallel to the second resistor 13 in a direction in which current flows between the signal output terminal of the photocoupler 109 and the gate of the P-channel MOSFET 105 when an on signal is outputted to the signal output terminal of photocoupler 109.

The NPN transistor 15 has an emitter (second potential reference-side conductive terminal), a collector (second non-potential reference-side conductive terminal), and a base (second conduction control terminal). The gate is connected to the signal output terminal of the photocoupler 109. The emitter is connected to the gate of the P-channel MOSFET 105. The collector is connected to the source of the P-channel MOSFET 105. The NPN transistor 15 establishes electrical conduction between the emitter and the collector when a current flows through the second resistor 13 in a direction opposite the direction of the diode 17.

The capacitance compensating capacitor C is connected in parallel to the second resistor 13.

In this configuration as well, as a result of the capacitance-compensating capacitor C being connected in parallel to the second resistor 13, an effect of preventing the flash on/off phenomenon with certainty can be achieved, in a manner similar to that according to the first embodiment.

The correspondence between this configuration and the constituent elements in claims is as follows. The resistor 107 corresponds to the first resistor element. The diode 17 corresponds to the diode. The photocoupler 109 corresponds to the signal conversion element. The NPN transistor 15 corresponds to the malfunction-prevention transistor.

The present disclosure is not limited only to the embodiments described above or shown in the drawings. The following modifications or expansions are possible. The photovoltaic coupler 149 according to the first embodiment and the photocoupler 109 according to the second embodiment may be interchanged. A voltage-drive transistor such as an insulated-gate bipolar transistor (IGBT) may be used instead of the N-channel MOSFET 145 according to the first embodiment.

What is claimed is:

1. A signal output circuit comprising:
   a signal conversion element that has a signal output terminal, converts an input electrical signal to an optical signal, converts the optical signal to an electrical signal, and outputs the electrical signal via the signal output terminal;
   a signal output transistor that has a first potential reference-side conductive terminal, a first non-potential reference-side conductive terminal, and a first conduction control terminal, and establishes electrical conduction between the first potential reference-side conductive terminal and the first non-potential reference-side conductive terminal when an on signal is supplied to the first conduction control terminal via the signal conversion element;
   a first resistor element that is connected between the signal output terminal of the signal conversion element and the first potential reference-side conductive terminal of the signal output transistor;
   a second resistor element that is connected between the signal output terminal of the signal conversion element and the first conduction control terminal of the signal output transistor,
   a diode that is connected in parallel to the second resistor element in a direction in which current flows between the signal output terminal of the signal conversion element and the first conduction control terminal of the signal output transistor when an on signal is outputted to the signal output terminal of signal conversion element;
   a malfunction-prevention transistor that has a second potential reference-side conductive terminal, a second non-potential reference-side conductive terminal, and a second conduction control terminal, the second conduction control terminal being connected to the signal output terminal of signal conversion element, the second potential reference-side conductive terminal being connected to the first conduction control terminal of the signal output transistor, the second non-potential reference-side conductive terminal being connected to the first potential reference-side conductive terminal of the signal output transistor, the malfunction-prevention transistor establishing electrical conduction between the second potential reference-side conductive terminal and the second non-potential reference-side conductive terminal when a current flows through the second resistor element in a direction opposite the direction of the diode; and
   a capacitance-compensating capacitor that is connected in parallel to the second resistor element.

2. The signal output circuit according to claim 1, wherein the signal output transistor is a field-effect transistor.

3. The signal output circuit according to claim 2, wherein the field-effect transistor is a metal-oxide-semiconductor field-effect transistor.

4. The signal output circuit according to claim 3, wherein the metal-oxide-semiconductor field-effect transistor is an N-channel metal-oxide-semiconductor field-effect transistor.

5. The signal output circuit according to claim 3, wherein the metal-oxide-semiconductor field-effect transistor is a P-channel metal-oxide-semiconductor field-effect transistor.

6. The signal output circuit according to claim 1, wherein the signal conversion element is a photovoltaic coupler.

7. The signal output circuit according to claim 1, wherein the signal conversion element is a photocoupler.

* * * * *